US011036399B2

(12) United States Patent
Kim

(10) Patent No.: US 11,036,399 B2
(45) Date of Patent: Jun. 15, 2021

(54) MEMORY SYSTEM AND OPERATING METHOD OF THE MEMORY SYSTEM

(71) Applicant: SK hynix Inc., Icheon-si (KR)

(72) Inventor: Sun-Woong Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 99 days.

(21) Appl. No.: 16/352,584

(22) Filed: Mar. 13, 2019

(65) Prior Publication Data

US 2019/0324664 A1 Oct. 24, 2019

(30) Foreign Application Priority Data

Apr. 23, 2018 (KR) .......................... 10-2018-0046707

(51) Int. Cl.
*G11C 29/00* (2006.01)
*G06F 3/06* (2006.01)
*G11C 29/04* (2006.01)
*G06F 12/02* (2006.01)

(52) U.S. Cl.
CPC .......... *G06F 3/0619* (2013.01); *G06F 3/0631* (2013.01); *G06F 3/0647* (2013.01); *G06F 3/0683* (2013.01); *G06F 12/023* (2013.01); *G11C 29/04* (2013.01); *G06F 2212/1032* (2013.01)

(58) Field of Classification Search
CPC .... G06F 3/0619; G06F 3/0631; G06F 3/0647; G06F 3/0683; G06F 2212/1032; G06F 12/023; G11C 29/04

USPC ....... 714/6.13, 6.2, 6.21, 6.32, 42, 710, 712, 714/762, 764, 767, 773; 365/200, 201
See application file for complete search history.

(56) References Cited

U.S. PATENT DOCUMENTS

| | | | |
|---|---|---|---|
| 2006/0143503 A1* | 6/2006 | Shaik .................. | G06F 3/061 714/6.2 |
| 2009/0144583 A1* | 6/2009 | Bruennert ............. | G11C 29/44 714/6.32 |
| 2017/0177244 A1* | 6/2017 | Khochare ........... | G06F 11/1612 |
| 2019/0057041 A1* | 2/2019 | Ha ...................... | G06F 11/3409 |

FOREIGN PATENT DOCUMENTS

KR 1019980041820 A 8/1998
KR 1020190048456 A 5/2019

* cited by examiner

Primary Examiner — Christine T. Tu
(74) Attorney, Agent, or Firm — William Park & Associates Ltd.

(57) ABSTRACT

A memory system may include: a plurality of memory devices each including a user area and an over-provisioning area (OP area); and a controller configured for controlling the plurality of memory devices, wherein the controller includes: a detection circuit configured for detecting a defective memory device among the plurality of memory devices; a selection circuit configured for selecting an available memory device excluding the defective memory device among the plurality of memory devices; and a processor configured for moving target data stored in the defective memory device into the OP area of the available memory device.

18 Claims, 10 Drawing Sheets

MEMORY SYSTEM AND OPERATING METHOD OF THE MEMORY SYSTEM

CROSS-REFERENCE TO RELATED APPLICATION

The present application claims priority to Korean Patent Application No. 10-2018-0046707, filed on Apr. 23, 2018, which is incorporated by reference herein in its entirety.

BACKGROUND

1. Technical Field

Various embodiments of the present disclosure generally relate to a memory system configured to processing data, and an operating method of the memory system.

2. Related Art

Data are becoming important assets in the fourth industrial revolution, and the demands for new technology in support of transferring and analyzing large-scale data at a high data rate are increasing. For example, as artificial intelligence, autonomous driving, robotics, health care, virtual reality (VR), augmented reality (AR), and smart home technologies spread, demands for servers or data centers are increasing.

A legacy data center includes resources for computing, networking, and storing data, in the same equipment. However, a future large-scale data center may have individually constructed resources that are logically restructured. For example, in the large-scale data center, the resources may be modularized at the level of racks, and the modularized resources may be restructured and supplied according to the usage. Therefore, a converged storage or memory device, which can be used for the future large-scale data center, is needed.

SUMMARY

In accordance with an embodiment, a memory system may include: a plurality of memory devices each including a user area and an over-provisioning area (OP area); and a controller configured for controlling the plurality of memory devices, wherein the controller includes: a detection circuit configured for detecting a defective memory device among the plurality of memory devices; a selection circuit configured for selecting an available memory device excluding the defective memory device among the plurality of memory devices; and a processor configured for moving target data stored in the defective memory device into the OP area of the available memory device.

In accordance with an embodiment, an operating method of a memory system may include: detecting a defective memory device among a plurality of memory devices; selecting an available memory device excluding the defective memory device among the plurality of memory devices; and moving target data stored in the defective memory device into the OP area of the available memory device.

In accordance with an embodiment, a computing system may include: a plurality of memory systems; and a memory system management unit (MMU) configured for communicating with the plurality of memory systems, wherein each of the memory systems includes a plurality of memory devices each including a user area and an OP area and a controller configured for controlling the plurality of memory devices, wherein the controller includes: a detection circuit configured for monitoring information on the reliability of the respective memory devices, and detecting a memory device as the defective memory device, the information on the reliability of the memory device having a lower value than a preset threshold value; a management circuit configured for storing availability information of the OP areas of the respective memory devices, and storing memory maps of the respective memory devices; a selection circuit configured for selecting an available memory device excluding the defective memory device among the plurality of memory devices, based on the availability information; and a processor configured for moving target data stored in the defective memory device into the OP area of the available memory device.

DETAILED DESCRIPTION

Figure 1:
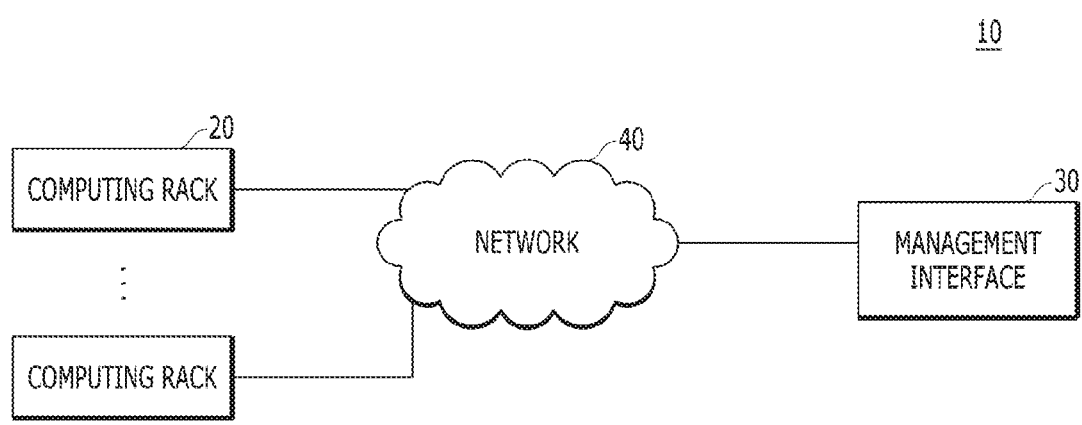
FIG. 1 is a block diagram illustrating a data processing system in accordance with an embodiment of the present disclosure.

Various embodiments of the present disclosure will be described below with reference to the accompanying drawings. Elements and features of present disclosure may, however, be configured or arranged differently than illustrated and described in the disclosed embodiments. Thus, the embodiments are not limited to the embodiments set forth herein. Rather, these embodiments are provided so that this disclosure is thorough and complete and fully conveys the scope of the present disclosure to those skilled in the art. Throughout the disclosure, like reference numerals refer to like parts throughout the various figures and embodiments of the present disclosure. Also, throughout the specification, reference to "an embodiment," "another embodiment," or the like is not necessarily to only one embodiment, and different references to any such phrase are not necessarily to the same embodiment(s).

Embodiments of the present disclosure may be directed to a memory system capable of recovering a bad memory device while maintaining the availability of the memory system and an operating method thereof.

FIG. 1 is a block diagram illustrating a data processing system 10. Referring to FIG. 1, the data processing system 10 may include a plurality of computing racks 20, a management interface 30, and a network 40 for communication between the computing racks 20 and the management interface 30. The data processing system 10 having this rack scale architecture may be used by a data center for processing large-scale data.

Each of the computing racks 20 may individually implement one computing device. Alternatively, each of the computing racks 20 may be combined with one or more other computing racks to implement one computing device. Example structures and operations of the computing racks 20 are described below.

The management interface 30 may provide an interactive interface for a user to control, administrate, or manage the data processing system 10. The management interface 30 may be implemented as any type of a computing device that includes any of a computer, a multi-processor system, a server, a rack-mount server, a board server, a lap-top computer, a notebook computer, a tablet computer, a wearable computing device, a network device, a web device, a distributed computing system, a processor-based system, a consumer electronic device, and the like.

In some embodiments of the present disclosure, the management interface 30 may be implemented as a distributed system having operation functions which may be performed by the computing racks 20 or having user interface functions which may be performed by the management interface 30. In other embodiments of the present disclosure, the management interface 30 may be implemented as a virtual cloud server that includes multi-computing devices distributed through the network 40. The management interface 30 may include a processor, an input/output subsystem, a memory, a data storage device, a communication circuit, and the like.

The network 40 may provide and/or receive data between the computing racks 20 and the management interface 30 and/or among the computing racks 20. The network 40 may be implemented with an appropriate number of various wired and/or wireless networks. For example, the network 40 may include a publicly accessible global network, such as a wired or wireless local area network (LAN), a wide area network (WAN), a cellular network, and/or the Internet. In addition, the network 40 may include an appropriate number of auxiliary network devices, such as auxiliary computers, routers, switches, and the like.

Figure 2:
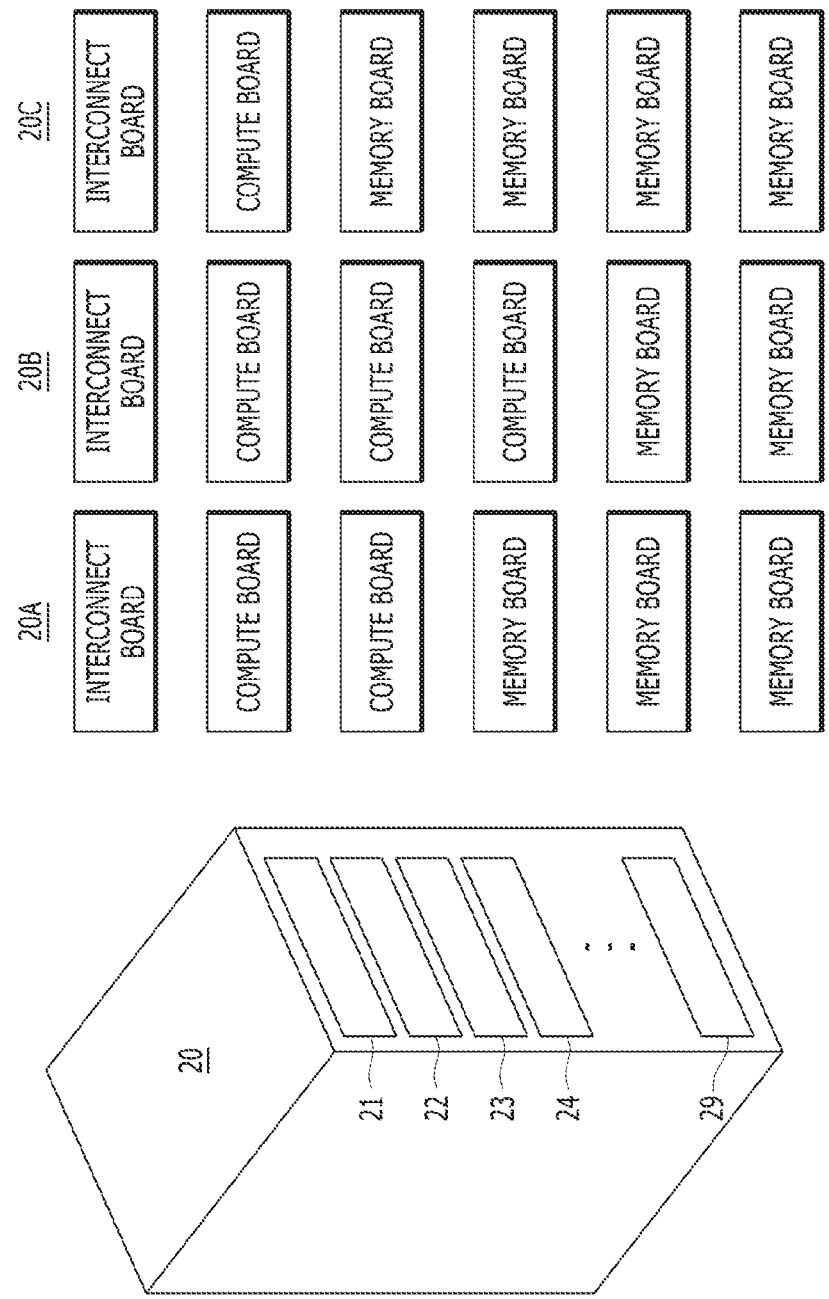
FIGS. 2 and 3 illustrate a computing rack in accordance with an embodiment of the present disclosure.

FIG. 2 illustrates an architecture of a computing rack in accordance with an embodiment of the present disclosure.

Referring to FIG. 2, the computing rack 20 may include constituent elements in various forms and structures. For example, the computing rack 20 may include a plurality of drawers 21 to 29. Each of the drawers 21 to 29 may include a plurality of modules, each of which may include a plurality of boards.

In various embodiments of the present disclosure, the computing rack 20 may be implemented by a combination of appropriate numbers of compute boards, memory boards, and/or interconnect boards. The computing rack 20 is described as a combination of boards, but the computing rack 20 may also be implemented by other elements such as drawers, modules, trays, boards, sashes, or other suitable units. The computing rack 20 may have a structure in which its constituent elements disaggregated and classified according to their functions. The computing rack 20 may have a structure of an interconnect board, a compute board, and a memory board with a classification order from the top down, although the computing rack 20 is not limited to such structure. The computing rack 20 and a computing device including the computing rack 20 may be referred to as 'a rack-scale system' or 'a disaggregated system.'

In an embodiment of the present disclosure, a computing device may be implemented as one computing rack 20. In other embodiments, the computing device may be implemented by all or some constituent elements of two or more computing racks 20, or some constituent elements of one computing rack 20.

In various embodiments of the present disclosure, a computing device may be implemented by a combination of appropriate numbers of compute boards, memory boards, and interconnect boards that are included in the computing rack 20. As illustrated in FIG. 2, a computing rack 20A may include two compute boards, three memory boards, and one interconnect board. In other examples, a computing rack 20B may include three compute boards, two memory boards, and one interconnect board. In other examples, a computing rack 20C may include one compute board, four memory boards, and one interconnect board.

Although FIG. 2 illustrates examples in which the computing rack 20 includes appropriate numbers of compute boards, memory boards, and interconnect boards, the computing rack 20 may include additional constituent elements that may be included in typical servers, such as a power system, a cooling system, an input/output device, and so on.

Figure 3:
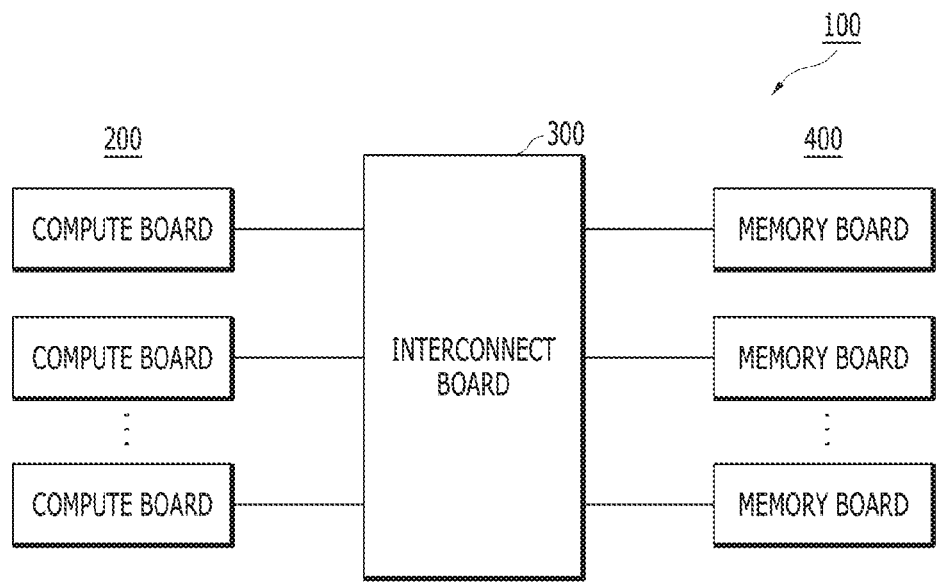

FIG. 3 illustrates a computing device 100 in accordance with an embodiment of the present disclosure.

Referring to FIG. 3, the computing device 100 may include a plurality of compute boards 200, a plurality of memory boards 400, and an interconnect board 300. The compute boards 200 may be pooled compute boards or pooled compute systems. The memory boards may be pooled memory boards or pooled memory systems. The computing device 100 is described as a combination of a plurality of boards, but the computing device 100 may also be implemented by elements such as drawers, modules, trays, boards, sashes, or other suitable units.

Each of the compute boards 200 may include one or more of processing elements such as a processor, a processing/control circuit, a central processing unit (CPU), and the like.

Each of the memory boards 400 may include one or more memories, such as volatile memories, non-volatile memories, or a combination thereof. For example, each of the memory boards 400 may include dynamic random access memories (DRAMs), flash memories, memory cards, hard disk drives (HDDs), solid state drives (SSDs), or a combination thereof.

Each of the memory boards 400 may be divided, allocated, or designated by and used by one or more processing elements that are included in each of the compute boards 200. Also, each of the memory boards 400 may store one or more operating systems (OS) that may be initialized and/or executed by the compute boards 200.

The interconnect board 300 may include a communication circuit, a communication device, or a combination thereof, which may be divided, allocated, or designated by and used by one or more processing elements included in each of the compute boards 200. For example, the interconnect board 300 may be implemented by any suitable number of network interface ports, interface cards, or interface switches. The interconnect board 300 may use protocols related to one or more wired communication technologies for communication. For example, the interconnect board 300 may support communication between the compute boards 200 and the memory boards 400 based on one or more of protocols such as peripheral component interconnect express (PCIe), QuickPath interconnect (QPI), Ethernet, and the like.

Figure 4:
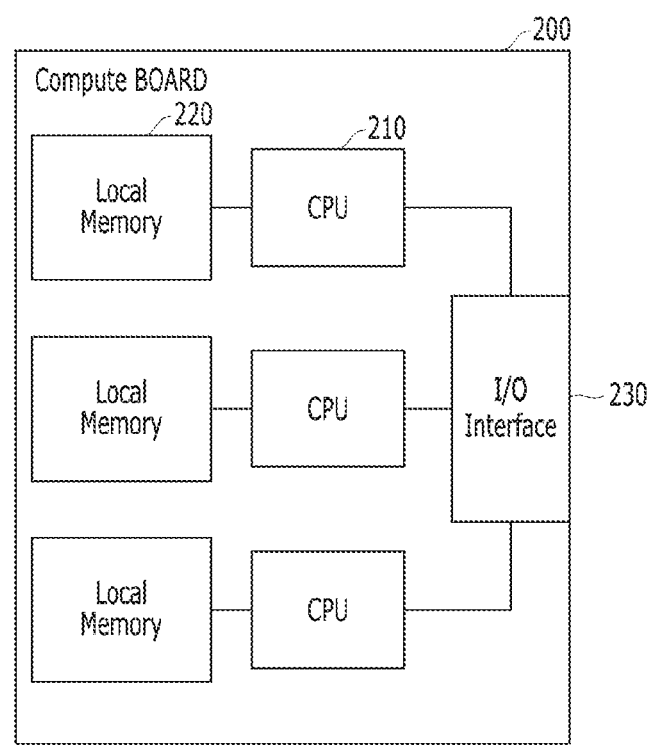
FIG. 4 is a block diagram illustrating a compute board in accordance with an embodiment of the present disclosure.

FIG. 4 is a block diagram illustrating a compute board 200 in accordance with an embodiment of the present disclosure.

Referring to FIG. 4, the compute board 200 may include one or more central processing units (CPUs) 210, one or more local memories 220, and an input/output (I/O) interface 230.

The CPUs 210 may divide, allocate, or designate one or more memory boards to be used, among the memory boards 400 illustrated in FIG. 3. Also, the CPUs 210 may initialize the one or more memory boards, and perform a data read operation and/or a data write (i.e., program) operation on the one or more memory boards.

The local memories 220 may store data to perform an operation of the CPUs 210. In various embodiments of the present disclosure, the local memories 220 may have a one-to-one correspondence with the CPUs 210.

The input/output interface 230 may support interfacing between the CPUs 210 and the memory boards 400 through the interconnect board 300 of FIG. 3. The input/output interface 230 may use protocols related to one or more wired communication technologies, output and provide data from the CPUs 210 to the interconnect board 300, and receive data inputted from the interconnect board 300 to the CPUs 210. For example, the input/output interface 230 may support communication between the CPUs 210 and the interconnect board 300 using one or more of protocols such as peripheral component interconnect express (PCIe), QuickPath interconnect (QPI), Ethernet and the like.

Figure 5:
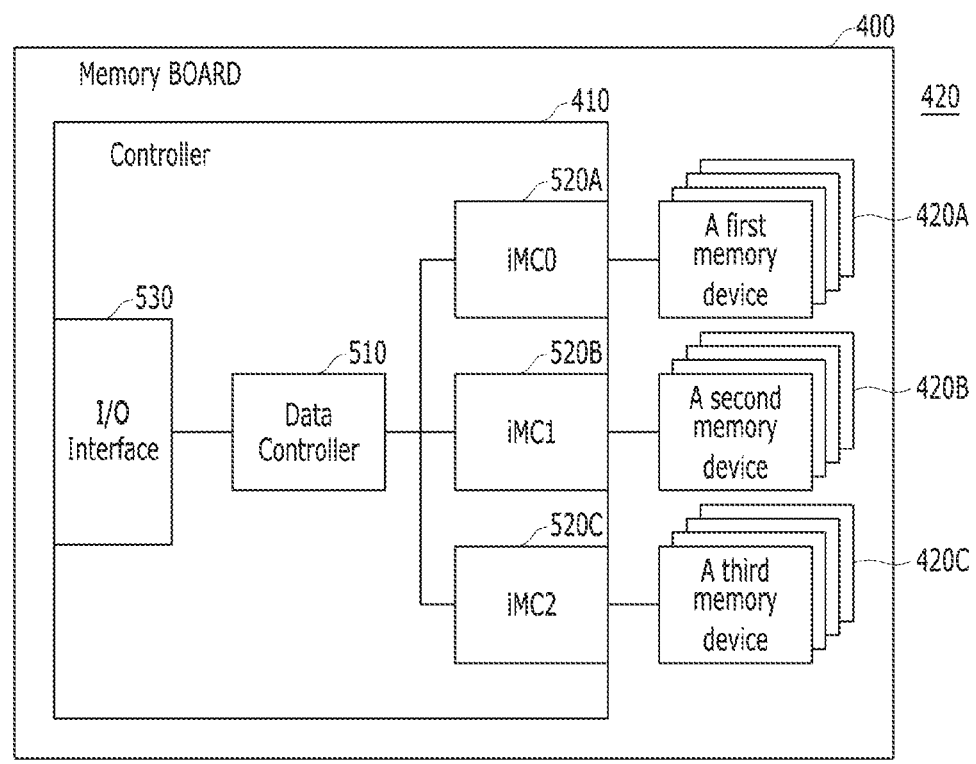
FIG. 5 is a block diagram illustrating a memory board in accordance with an embodiment of the present disclosure.

FIG. 5 is a block diagram illustrating a memory board 400 in accordance with an embodiment of the present disclosure.

Referring to FIG. 5, the memory board 400 may include a controller 410 and a plurality of memories 420. The plurality of memories 420 may store (or write) data therein and output (or read) stored data under the control of the controller 410. The plurality of memories 420 may include a plurality of first memory devices 420A, a plurality of second memory devices 4203, and a plurality of third memory devices 420C. Each of the first, second, and third memory device 420A, 420B, and 420C may include multiple memories or memory devices. The first memory device 420A, the second memory device 420B, and the third memory device 420C may have the same characteristics or different characteristics. According to various embodiments of the present disclosure, the first memory device 420A, the second memory device 420B, and the third memory device 420C may include memories having the same characteristics or memories having different characteristics, in terms of capacity or latency.

The controller 410 may include a data controller 510, memory controllers (MC) 520A to 520C, and an input/output (I/O) interface 530.

The data controller 510 may control data provided and received between the memories included in the plurality of memories 420 and the compute boards 200 of FIG. 3. For example, in response to a write request or command, the data controller 510 may receive write data from the compute boards 200 and control a write operation for writing the write data in a corresponding memory among the plurality of memories 420. In a read operation, in response to a read request or command, the data controller 510 may read out data stored in a particular memory among the plurality of memories 420 and control the read operation for outputting the read data to a corresponding compute board among the compute boards 200.

The memory controllers 520A to 520C may be disposed between the data controller 510 and the memories from the plurality of memories 420, and may support interfacing between the data controller 510 and the memories included in the plurality of memories 420. The memory controllers 520A to 520C may include a first memory controller (iMC0) 520A, a second memory controller (iMC1) 520B, and a third memory controller (iMC2) 520C that respectively correspond to the first memory group 420A, the second memory group 420B, and the third memory group 420C included in the plurality of memories 420. The first memory controller (iMC0) 520A may be disposed between the data controller 510 and the plurality of first memory devices 420A, and may support the transmission and/or reception of data between the data controller 510 and the plurality of first memory devices 420A. The second memory controller (iMC1) 520B may be disposed between the data controller 510 and the plurality of second memory devices 420B, and may support the transmission and/or reception of data between the data controller 510 and the plurality of second memory devices 420B. The third memory controller (iMC2) 520C may be disposed between the data controller 510 and the plurality of third memory devices 420C, and may support the transmission and/or reception of data between the data controller 510 and the plurality of third memory devices 420C, Although an example where the controller 410 includes three memory controllers is described herein, when the plurality of first memory devices 420A, the plurality of second memory devices 420B, and the plurality of third memory devices 420C include DRAMs, the controller 410 may include a single memory controller.

The input/output interface 530 may support interfacing between the data controller 510 and the compute boards 200 through the interconnect board 300 of FIG. 3. The input/output interface 530 may operate according to one or more protocols related to wired communication technologies to provide read data from the data controller 510 to the interconnect board 300, and to provide write data from the interconnect board 300 to the data controller 510. The input/output interface may be a serial interface that can support Hot-plug to connect and disconnect the memory devices easily. For example, the input/output interface 530 may support communication between the data controller 510 and the interconnect board 300 based on one or more of protocols such as peripheral component interconnect express (PCIe), QuickPath interconnect (QPI), Ethernet, and the like.

In order to process large amounts of data, a plurality of compute boards 200 and a plurality of memory boards 400 may be required as described with reference to FIGS. 2 to 5. Furthermore, each of the memory boards 400 may include a plurality of memory devices 420 for storing large amounts of data.

However, when a defect occurs in any one of the plurality of memory devices, the entire system may be suspended to recover the memory device in which the defect occurred (hereafter, referred to as a defective memory device). At this time, data stored in the defective memory device might not be protected. An embodiment suggests a memory system 700, a computing system 1000 and operating methods thereof, which may recover a defective memory device while maintaining the availability of most of system, even though the defective memory device occurs in the plurality of memory devices.

Figure 6:
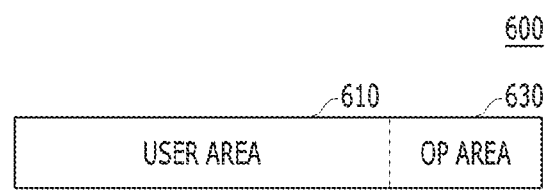
FIG. 6 illustrates the structure of a memory device in accordance with an embodiment of the present disclosure.

FIG. 6 illustrates the structure of a memory device 600 in accordance with an embodiment. The memory device 600 illustrated in FIG. 6 may correspond to each of the memory devices included in the plurality of memories 420 illustrated in FIG. 5.

The memory device 600 may generally include a user area 610 for storing data and an over-provisioning area (hereafter, OP area) 630 which is not used unless there is a special reason.

The OP area 630 may be provided to increase the lifetime of the memory device. The memory device 600 may include a plurality of memory cells to store data. Each of the memory cells may have a constant lifetime. For example, when data are written 10,000 times to a memory cell, the lifetime of the corresponding memory cell may come to an end. Thus, according to one of methods for preserving the lifetimes of memory cells, when data are written 8,000 times to a memory cell, a write operation may be blocked from being performed on the corresponding memory cell, and only a read operation may be performed on the corresponding memory cell. In order to preserve the lifetimes of a plurality of memory cells through the above-described method, the plurality of memory cells need to be used as uniformly as possible. That is, when a specific memory cell is repeatedly used, the lifetime of the corresponding memory cell may be rapidly reduced. However, when there is a memory cell on which use is concentrated, for example, a memory cell in which data for performing an OS operation are stored or a memory cell in which frequently used data are stored, the memory device 600 may include a spare region to prevent excessive use of the corresponding memory cell. That is, in order to prevent excessive use of the corresponding memory cell, data which are to be stored in the memory cell may be stored in the spare region. Such a spare region is the OP area 630 In an embodiment, the memory device may have a certain ratio of OP area 630.

Embodiments which will be described with reference to FIGS. 7 to 12 suggest a memory system 700, a computing system 1000 and operating method thereof, which can recover a defective memory device while maintaining integrity, using the above-described OP area 630, when a defect in the memory device occurs.

Figure 7:
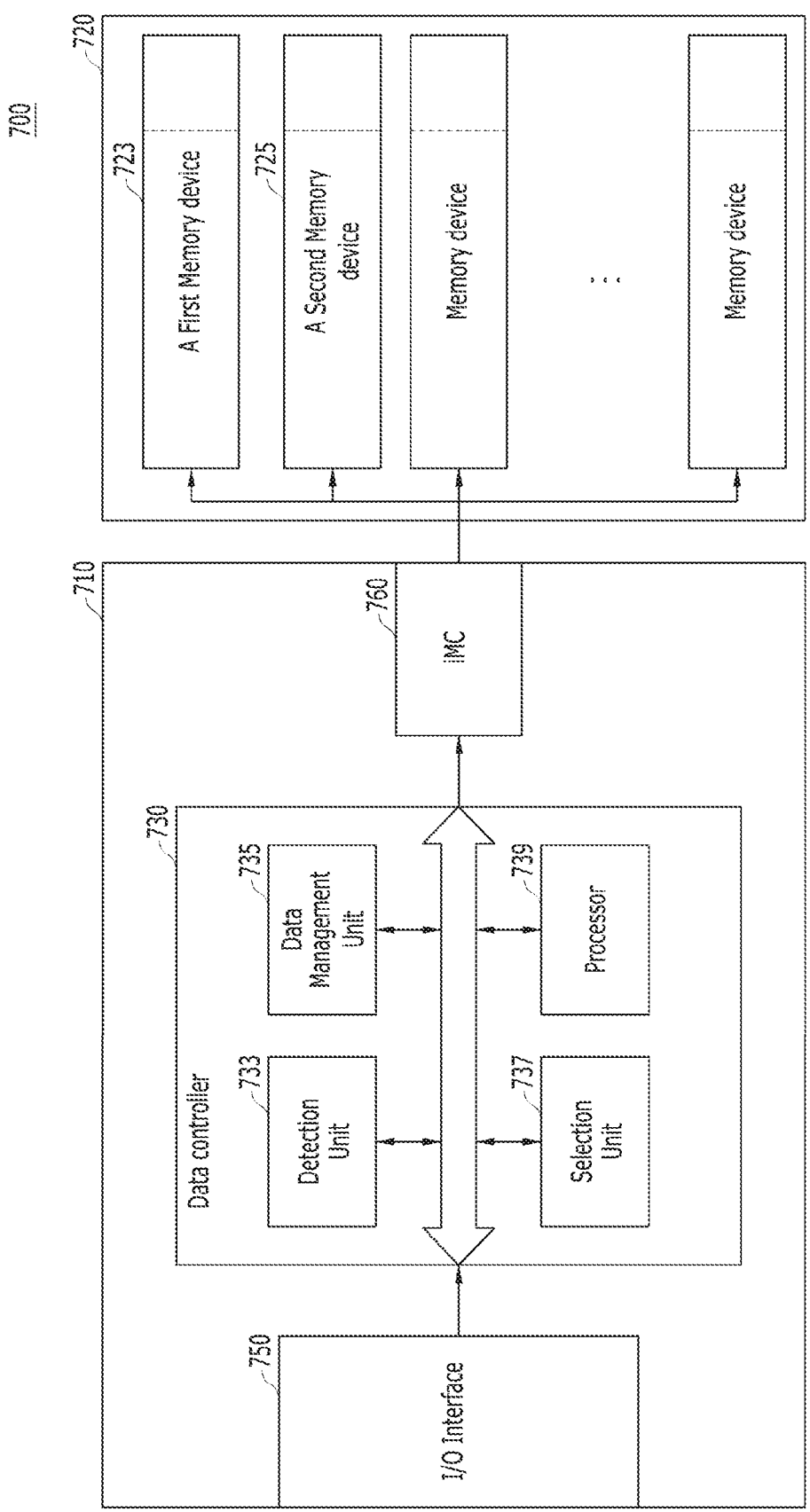
FIG. 7 illustrates the structure of a memory system in accordance with an embodiment of the present disclosure.

FIG. 7 illustrates the structure of a memory system 700 in accordance with an embodiment. Referring to FIG. 5, the memory system 700 may correspond to the memory board 400.

The memory system 700 may include a controller 710 and a plurality of memory devices 720. The controller 710 may correspond to the controller 410 illustrated in FIG. 5, and the plurality of memory devices 720 may correspond to the plurality of memories 420 illustrated in FIG. 5. In an embodiment, the memory devices included in the plurality of memory devices 720 may each have the same kind of memory device. However, this is only for convenience of description, and the present embodiment is not limited thereto. In other embodiments, the memory devices included in the plurality of memory devices 720 may include different kinds of memory devices, may include the same kinds of memory devices, or have any combination thereof.

The controller 710 may include a data controller 730, an I/O interface 750 and a memory controller 760. The data controller 730 may correspond to the data controller 510 illustrated in FIG. 5, and the I/O interface 750 may correspond to the I/O interface 530 illustrated in FIG. 5. The memory controller 760 may correspond to each of the memory controllers 520A to 520C illustrated in FIG. 5.

The I/O interface 750 may support interfacing between the data controller 730 and the compute boards 200 through the interconnect board 300 of FIG. 3. The memory controller 760 may be positioned between the data controller 730 and the plurality of memory devices 720, and support interfacing therebetween. As described above, the plurality of memory devices 720 (referring to FIG. 7) may include memory devices that are all the same or are one kind of memory device, for convenience of description. Therefore, the memory controller 760 capable of supporting the interfacing between the respective different memory devices included in the plurality of memory devices 720 may also include the same type of memory controllers or the memory controllers included in the memory controller 760 may all be one kind of memory controller. These memory controllers of the same type included in the memory controller 760 may be included in the controller 710. In other embodiments, if the memory devices within the plurality of memory devices 720 are different types of memory devices or are not one kind of memory device, then different types of memory controllers or not one kind of memory controller is included in the memory controller 760 so as to support the different types of interfacing associated with the different types of memory devices included in the plurality of memory devices 720.

The input/output interface may be a serial interface that can support Hot-plug to connect and disconnect the memory devices easily.

The data controller 730 may include a detection circuit 733, a data management circuit 735, a selection circuit 737 and a processor 739.

The detection circuit 733 may monitor how reliable the plurality of memory devices 720 are, and, thus, may detect a defective memory device among the memory devices 720. For example, an error correction code (KC) circuit (not illustrated) included in the data controller 730 may perform an ECC decoding operation on data provided from the plurality of memory devices 720, and determine whether the provided data contain error data, through the ECC decoding operation. The ECC circuit (not illustrated) may provide information on the determined error data to the detection circuit 733, and the detection circuit 733 may manage the error data in response to the plurality of memory devices 720. The detection circuit 733 may detect a defective memory device among the plurality of memory devices 720, based on the number of errors in the data. The memory device having the defect or the defective memory device may be a memory device of which the reliability of has been determined to be lower than a preset threshold value. For example, the reliability may be determined based on the number of error data which occur in the corresponding memory device. When the number of error data in a specific memory device is higher than the preset threshold value, the detection circuit 733 may determine that the corresponding memory device is a defective memory device. However, this is only an example, and the present embodiments are not limited thereto. The word "preset" as used herein with respect to a parameter, such as a preset threshold value or preset standard, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The detection circuit 733 may store the information on the determined error data corresponding to the respective memory devices 720. For example, when a first memory device 723 is detected as a defective memory device, the detection circuit 733 may update information on the reliability corresponding to the first memory device 723 and information on the determined error data corresponding to the first memory device 723. In other embodiments, the detection circuit 733 might not separately update the information on the determined error data and/or the information on the reliability corresponding to a second memory device 725 which has been determined to be a normal memory device. Afterwards, when the first memory device 723 is recovered and becomes a normal memory device, for example, when the number of error data which has occurred in the corresponding memory device is lower than a preset threshold value, the detection circuit 733 may update the information on the reliability of the corresponding first memory device 723 again. For example, the detection circuit 733 may manage the information pertaining to the reliability of each of the respective memory devices included in the plurality of memory devices 720 by indicating information on a defective memory device with a '1' and indicating information on a normal memory device with a '0'. However, this is only an example, and the present embodiments are not limited thereto.

The data management circuit 735 may manage the OP areas of the respective memory devices within the plurality of memory devices 720. For example, the data management circuit 735 may monitor available OP areas among the OP areas of the respective memory devices within the plurality of memory devices 720, and may store availability information on the OP areas of the respective memory devices (hereafter, available OP information). For example, the data management circuit 735 may store the available OP information associated with the corresponding memory devices by indicating the available OP areas of the respective memory devices with a '1' and indicating available OP information corresponding to unavailable OP areas with a '0'. In other embodiments, the data management circuit 735 may store the available OP information associated with the corresponding memory devices by indicating the available OP areas of the respective memory devices with a '0' and indicating available OP information corresponding to unavailable OP areas with a In some embodiments, the data management circuit 735 may only store the available OP information associated with the corresponding memory devices indicating available OP areas of the respective memory devices. In some embodiments, the data management circuit 735 may only store the available OP information associated with the corresponding memory devices indicating unavailable OP areas of the respective memory devices. In some embodiments, the data management circuit 735 may store the available OP information associated with the corresponding memory devices indicating available OP areas of the respective memory devices and the available OP information associated with the corresponding memory devices indicating unavailable OP areas of the respective memory devices. However, these are only examples, and the present embodiments are not limited thereto.

The data management circuit 735 may store memory maps of the respective memory devices 720. Therefore, when data are moved among the plurality of memory devices 720, the data management circuit 735 may update the memory maps to reflect the data movement.

Based on the available OP information, the selection circuit 737 may search for a memory device having an OP area in which data stored in the defective memory device can be stored, within the memory system 700. Hereafter, the data stored in the defective memory device may be referred to as target data, and the memory device having the OP area in which the data stored in the defective memory device can be stored may be referred to as an available memory device.

Furthermore, the selection circuit 737 may select an available memory device according to a preset standard. When the size of the data stored in the defective memory device is larger than the OP area of the available memory device, the selection circuit 737 may select a plurality of available memory devices to store the data in. However, this is only an example, and the present embodiments are not limited thereto.

In other embodiments, when no available memory devices are present in the memory system 700, the target data may be provided to another memory system. This operation will be described below with reference to FIG. 11.

The processor 739 may move the target data from the defective memory device to the OP area of the available memory device selected by the selection circuit 737. For example, the processor 739 may read the target data from the defective memory device. Although not illustrated in the drawing, the read target data may be temporarily stored in an internal memory of the data controller 730. The processor 739 may store the target data in the OP area of the available memory device. After the target data have been moved to the OP area of the available memory device, the data management circuit 735 may update the memory map to reflect address information corresponding to the target data. When a read request for the target data is inputted afterwards, the processor 739 may read the target data stored in the OP area based on the memory map.

Then, when the defective memory device has recovered to become a normal memory device (hereafter, referred to as a recovered memory device), the processor 739 may read the target data stored in the OP area, and store the target data in the recovered memory device. The detection circuit 733 may update the information pertaining to the reliability of the recovered memory device, and the data management circuit 735 may update the memory map to reflect address information corresponding to the target data.

Figure 8:
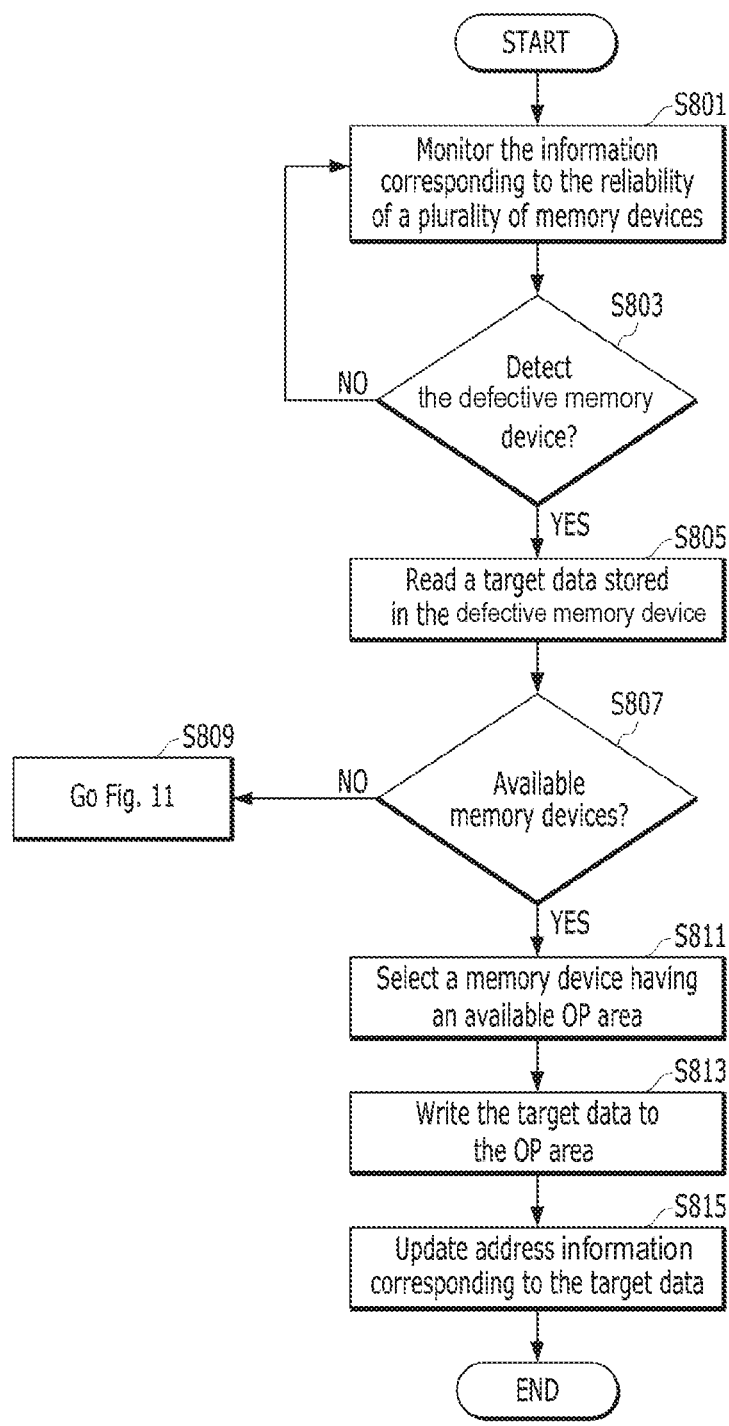
FIG. 8 is a flowchart illustrating an operation of the data controller in accordance with an embodiment of the present disclosure.

FIG. 8 is a flowchart illustrating an operation of the data controller 730 in accordance with an embodiment.

First, the detection circuit 733 may monitor the information pertaining to the reliability of the plurality of memory devices 720 at step S801. For example, the detection circuit 733 may monitor the information on the determined error data corresponding to a memory device or memory devices of the plurality of memory devices 720 at step S801.

At step S803, the detection circuit 733 may detect a memory device as a defective memory device among the plurality of memory devices 720, based on the monitored information corresponding to the reliability of the memory device, the memory device having a number of data errors greater than or equal to a preset threshold value.

When no defective memory devices are detected (N at step S803), the detection circuit 733 may continuously monitor for information corresponding to the reliability of the memory devices to detect a number of data errors exceeding or equaling the preset threshold value for each memory device at step S801.

When a defective memory device is detected (V at step S803), the processor 739 may read target data stored in the defective memory device at step S805. The processor 739 may temporarily store the target data in the internal memory of the data controller 730.

At step S807, the selection circuit 737 may search for an available memory device in the memory system 700, based on the available OP area information of the plurality of memory devices 720, stored in the data management circuit 735.

When no available memory devices are present in the memory system 700 (N at step S807), an operation which will be described with reference to FIG. 10 may be performed at step S809. This operation will be described with reference to FIG. 10.

However, when available memory devices are present in the memory system 700 (Y at step S807), the selection circuit 737 may select an available memory device according to the preset standard at step S811.

At step S813, the processor 739 may store the target data in the OP area of the available memory device. In some embodiments, at step S813, the processor 739 may store the target data in multiple OP areas, and each of the OP areas may be located in a corresponding available memory device to store the target data within different available memory devices.

At step S815, the data management circuit 735 may update address information corresponding to the target data.

Figure 9:
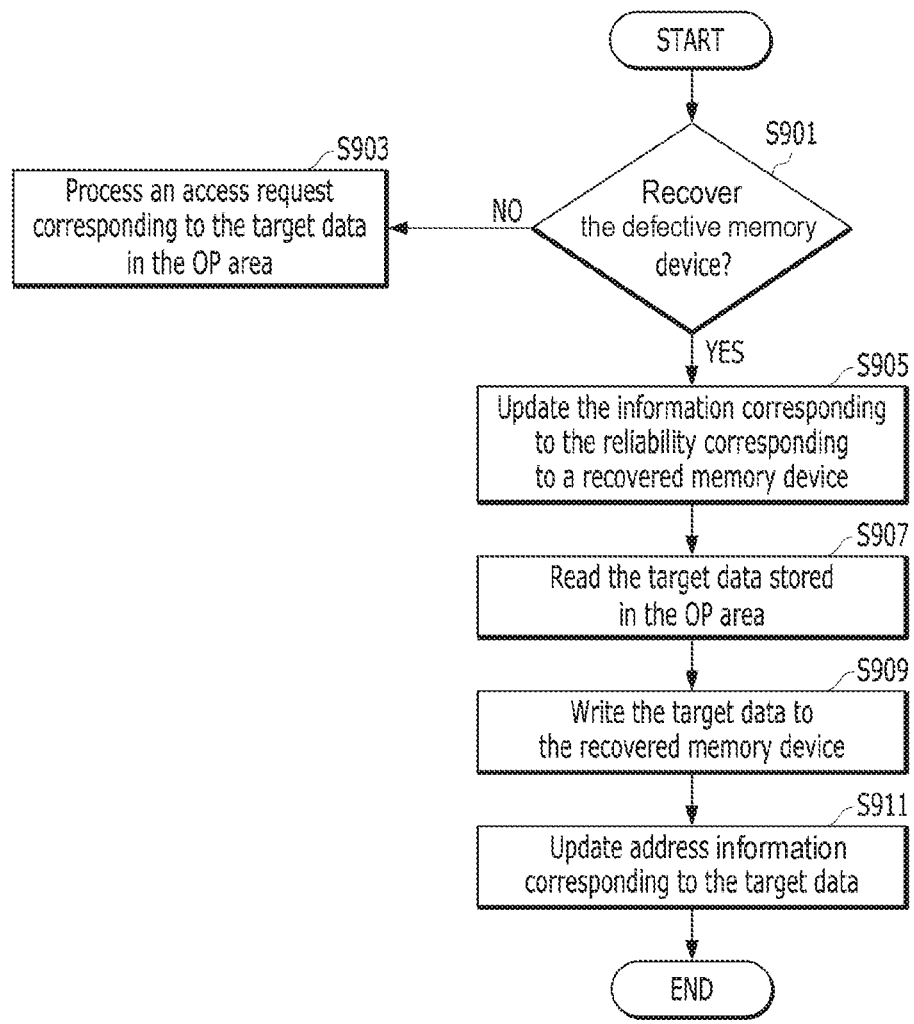
FIG. 9 is a flowchart illustrating an operation of the data controller in accordance with an embodiment of the present disclosure.

FIG. 9 is a flowchart illustrating an operation of the data controller 730 in accordance with an embodiment. The operation of the data controller 730 illustrated in FIG. 9 may be performed after the operation of the data controller 730, which has been described with reference to FIG. 8.

At step S901, the defective memory device may be recovered into a recovered memory device.

When the defective memory device was not recovered (N at step S901), an access request corresponding to the target data may be executed in the OP area described with reference to FIG. 8 at step S903. For example, for the read request corresponding to the target data, the processor 739 may control the available memory device having the target data stored therein to read the target data.

However, when the defective memory device has been recovered (Y at step S901), the data management circuit 735 may update the information corresponding to the reliability of the corresponding recovered memory device at step S905.

At step S907, the processor 739 may read the target data from the OP area in which the target data are currently stored. The target data may be temporarily stored in the internal memory of the data controller 730.

At step S909, the processor 739 may store the target data in the recovered memory device.

Finally, at step S911, the data management circuit 735 may update address information corresponding to the target data. For example, the data management circuit 735 may update the memory map to reflect the address information of the target data stored in the recovered memory device.

In accordance with an embodiment described with reference to FIGS. 7 to 9, although a defective memory device occurs in the plurality of memory devices 720, the defective memory device can be recovered while the availability of most of the memory system 700 is maintained through the above-described process.

So far, the operation process in accordance with an embodiment, which recovers a defective memory device occurring in the single memory system 700 while maintaining the availability for most of the memory system 700, has been described with reference to FIGS. 7 to 9. However, when the single memory system 700 has no available OP area capable of temporarily storing data stored in the defective memory device, it may be impossible to recover the defective memory device while maintaining an availability for the memory system 700. Hereafter, a computing system 1000 capable of solving such a problem will be described with reference to FIGS. 10 to 12.

Figure 10:
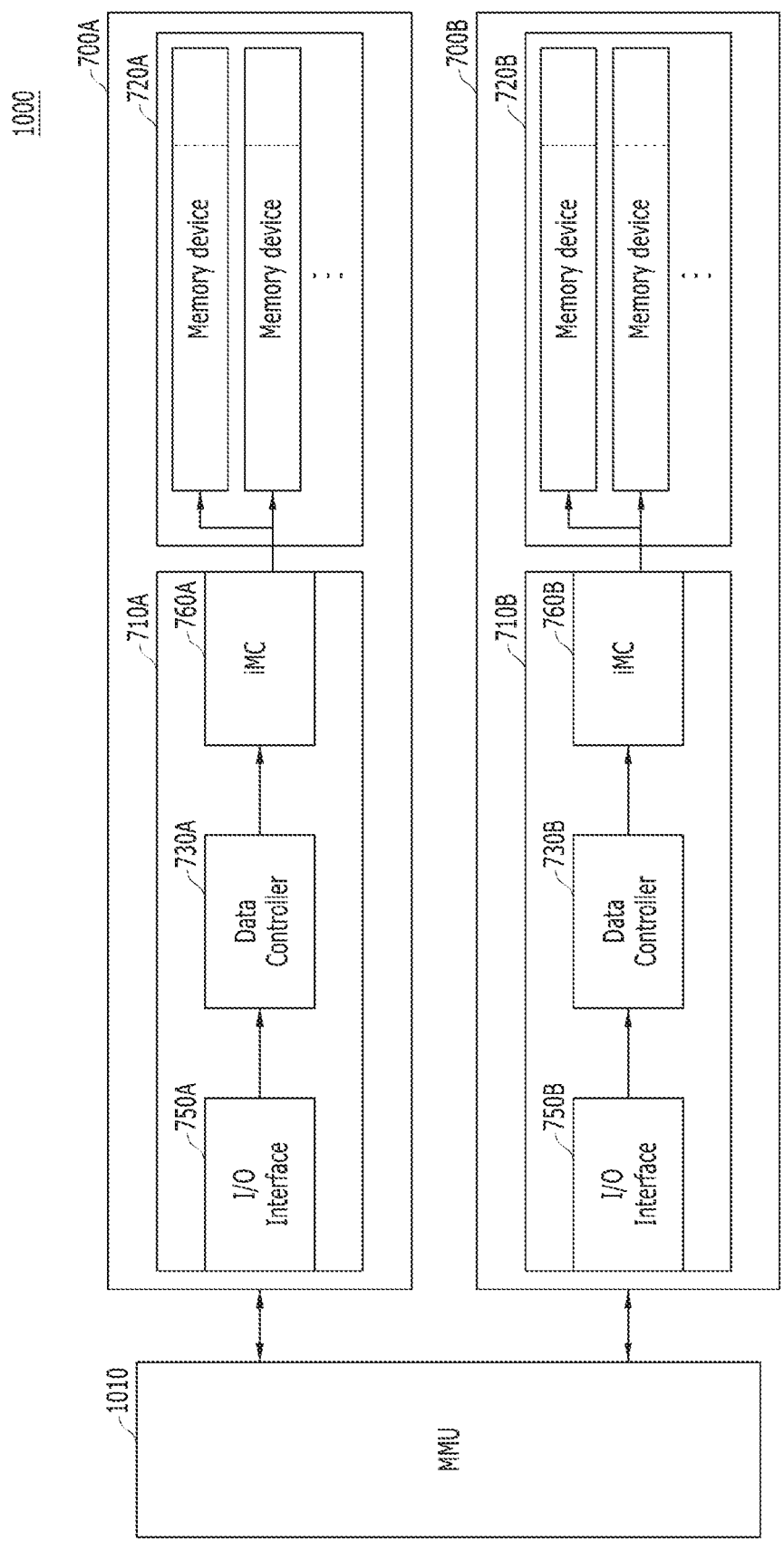
FIG. 10 illustrates the structure of a computing system in accordance with an embodiment of the present disclosure.

FIG. 10 illustrates the structure of a computing system 1000 in accordance with an embodiment.

The computing system 1000 may include a plurality of memory systems 700A and 700B and a memory system management unit (MMU) 1010. FIG. 10 illustrates that the computing system 1000 includes only the first and second memory systems 700A and 700B. However, the computing system 1000 may include more memory systems.

Each of the memory systems 700A and 700B may correspond to the memory system 700 described with reference to FIG. 7. Furthermore, controllers 710A and 710B and pluralities of memory devices 720A and 720B, which are included in the memory systems 700A and 700B, may correspond to the controller 710 and the plurality of memory devices 720, respectively, which are illustrated in FIG. 7.

The MMU 1010 may correspond to the compute board 200 and the interconnect board 300 which have been described with reference to FIGS. 2 to 4. Thus, the MMU 1010 may manage the plurality of memory systems 700A and 700B, and perform data communication with the plurality of memory systems 700A and 700B. That is, the MMU 1010 may provide the data received from the first memory system 700A to the second memory system 700B. The MMU 1010 can also provide the data received from the second memory system 700B to the first memory system 700A. In other embodiments, the MMU 1010 may manage two or more memory systems.

The MMU 1010 may receive the available OP information of the memory devices 720A and 720B included in the memory systems 700A and 700B from data controllers 730A and 730B through I/O interfaces 750A and 750B, respectively. Therefore, the MMU 1010 may recognize the information on the available OP areas of the respective memory devices. When the available OP information is updated, the MMU 1010 may receive the updated information from the data controllers 730A and 730B, and update the available OP information stored in the MMU 1010.

The MMU 1010 may receive the memory maps of the memory devices 720A and 720B from the data controllers 730A and 730B through the I/O interfaces 750A and 750B, respectively. The MMU 1010 may store a global map into which the memory maps are reflected. After data movement has occurred, the MMU 1010 may receive updated address information from the data controllers 730A and 730B, and update the memory maps and/or the global map which are stored in the MMU 1010.

For convenience of description, suppose that a defective memory device has occurred among the plurality of first memory devices 720A included in the first memory system 700A, and there are no available memory devices among the plurality of first memory devices 720A. Furthermore, suppose that there are available memory devices in the plurality of second memory devices 720B.

The first data controller 730A may read target data stored in the defective memory device. The first data controller 730A may search for an available memory device to temporarily store the target data, among the plurality of first memory devices 720A. However, when there are no available memory devices among the plurality of first memory devices 720A, the first data controller 730A may provide the target data to the MMU 1010 through the first I/O interface 750A.

The MMU 1010 may search for the second memory 700B including an available memory device capable of temporarily storing the target data received from the first memory system 700A, based on the available OP information received from the plurality of memory systems 700A and 700B. Then, the MMU 1010 may provide the target data to the second memory system 700B.

The second data controller 730B may receive the target data through the second I/O interface 750B. The second data controller 730B may search for an available memory device to temporarily store the target data, among the plurality of second memory devices 720B. Furthermore, the second data controller 730B may store the target data in the OP area of the found available memory device.

The first and second data controllers 730A and 730B may update address information corresponding to the target data. For example, the first data controller 730A may update the address information corresponding to the target data, in order to indicate that the target data are not stored in the plurality of first memory devices 720A, and the second data controller 730B may update the address information corresponding to the target data in order to indicate that the target data are stored in the OP area. Furthermore, the first and second data controllers 730A and 730B may provide the updated address information to the MMU 1010. In order to reflect the address information of the received target data, the MMU 1010 may update the memory maps and/or the global maps of the first and second memory systems 700A and 700B, respectively.

Then, when the defective memory device included in the plurality of first memory devices 720A is recovered, an operation for storing the target data in the recovered memory device in the reverse direction of the above-described operation process may be performed.

The first data controller 730A may provide the MMU 1010 with information indicating that the defective memory device has been recovered and is now a recovered memory device. At this time, the MMU 1010 may update the information on the reliability of the recovered memory device. The MMU 1010 may issue a read request for the target data to the second memory system 700B. The second data controller 730B may read the target data, and provide the read target data to the MMU 1010. The MMU 1010 may provide the received target data to the first memory system 700A. The first data controller 730A may receive the target data from the MMU 1010, and store the target data in the recovered memory device.

The first and second data controllers 730A and 730B may update the address information corresponding to the target data. For example, the second data controller 730B may update the address information corresponding to the target data in order to indicate that the target data are not stored in the plurality of second memory devices 720B, and the first data controller 730A may update the address information corresponding to the target data in order to indicate that the target data are stored in the recovered memory device. Furthermore, the first and second data controllers 730A and 730B may provide the updated address information to the MMU 1010. In order to reflect the received address information of the target data, the MMU 1010 may update the memory maps and/or the global maps of the first and second memory systems 700A and 700B, respectively.

Figure 11:
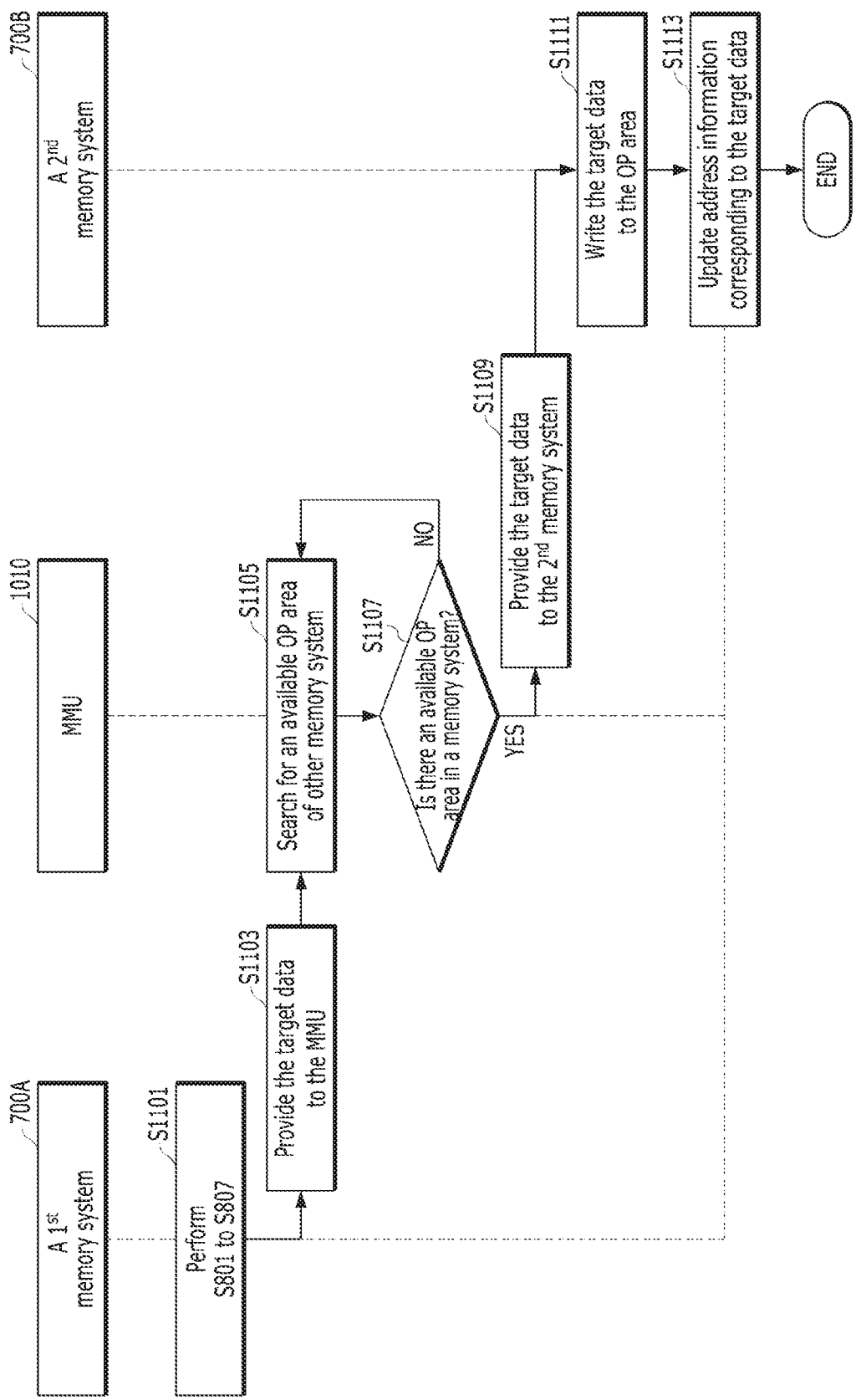
FIG. 11 is a flowchart illustrating an operation of the computing system in accordance with an embodiment of the present disclosure.

FIG. 11 is a flowchart illustrating an operation of the computing system 1000 in accordance with an embodiment. Furthermore, operations illustrated in FIG. 11 may correspond to step S809 illustrated in FIG. 8. That is, operations of steps S1101 to S1111 may correspond to the subsequent operations of step S807 illustrated in FIG. 8.

At step S1101, the first memory system 700A may perform operations corresponding to steps S801 to S807 illustrated in FIG. 8.

At step S1103, the first memory system 700A may provide the target data to the MMU 1010. For example, the first data controller 730A included in the first memory system 700A may provide the target data to the MMU 1010 through the first I/O interface 750A.

At step S1105, the MMU 1010 may search for a memory system including an available memory device among the memory systems other than the first memory system 700A.

When there is no available memory device in another memory system (N at step S1107), the MMU 1010 may search for another memory system including an available memory device at step S1105.

However, when there is an available memory device (Y at step S1107) in a specific memory system (hereafter, the second memory system 700B), the MMU 1010 may provide the target data to the second memory system 700B at step S1109.

At step S1111, the second data controller 730B may store the target data in the OP area of the available memory device.

Then, as described with reference to FIG. 10, the first and second data controllers 730A and 730B and the MMU 1010 may update the address information corresponding to the target data at step S1113.

Figure 12:
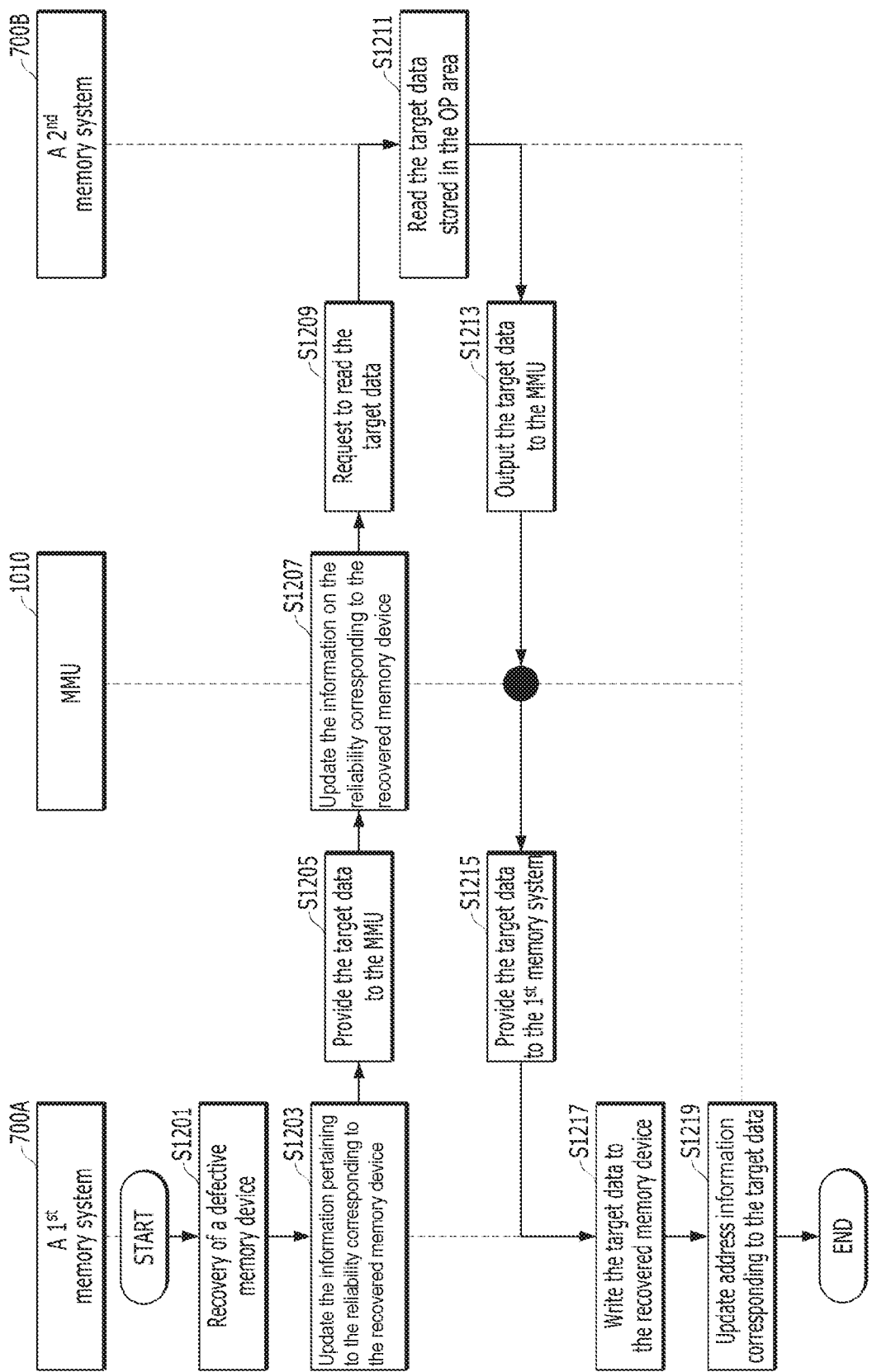
FIG. 12 is a flowchart illustrating an operation of the computing system in accordance with an embodiment of the present disclosure.

FIG. 12 is a flowchart illustrating an operation of the computing system 1000 in accordance with an embodiment.

Operations illustrated in FIG. 12 may be performed after the operation illustrated in FIG. 11. For example, the operation in which the computing system 1000 stores the target data in the recovered memory device when the defective memory device having occurred in the first memory system 700A is recovered as described with reference to FIG. 11 will be described with reference to FIG. 12. However, although not illustrated in the drawing, an access request for the target data may be performed on the OP area of the second memory system 700B, in which the target data are currently stored, when the defective memory device is not recovered. For example, when a read request for the target data is issued, the second controller 730B may read the target data stored in the OP area.

At step S1201, the defective memory device may be recovered to become a recovered memory device.

At step S1203, the first data controller 730A may update information pertaining to a reliability corresponding to the recovered memory device. For example, the first data controller 730A may update the information on the reliability of the recovered memory device to be '0', after the defective memory device of which the reliability was '1' has been recovered to be the recovered memory device.

At step S1205, the first memory system 700A may provide the updated reliability information to the MMU 1010.

At step S1207, the MMU 1010 may update information pertaining to a reliability corresponding to the first memory system 700A based on the information on the reliability received from the first memory system 700A.

Then, in order to move the target data to the first memory system 700A in which the target data had been stored, the MMU 1010 may request the second memory system 700B to read the target data at step S1209.

At step S1211, the second memory system 7003 may read the target data according to the read request. For example, the second data controller 730B may control the memory device to read the target data, the memory device having the OP area in which the target data are stored.

At step S1213, the second memory system 700B may output the target data to the MMU 1213.

At step S1215, the MMU 1010 may provide the target data to the first memory system 700A.

At step S1217, the first memory system 700A may store the target data received from the MMU 1010 in the recovered memory device. For example, the first data controller 730A may control the recovered memory device to write the target data.

Then, as described with reference to FIG. 10, the first and second data controllers 730A and 730B and the MMU 1010 may update the address information corresponding to the target data at step S1219.

As described with reference to FIGS. 10 to 12, the computing system including the plurality of memory systems can overcome the problem of the single memory system 700. As a result, the computing system can recover a defective memory device while maintaining most of the memory system 700.

Although various embodiments have been described and illustrated, it will be apparent to those skilled in the art in light of the present disclosure that various changes and modifications may be made without departing from the spirit and scope of the disclosure as defined in the following claims.

What is claimed is:

1. A memory system comprising:
 a plurality of memory devices each including a user area and an over-provisioning area (OP area); and
 a controller configured for controlling the plurality of memory devices,
 wherein the controller comprises:
 a detection circuit configured for detecting a defective memory device among the plurality of memory devices;
 a selection circuit configured for selecting an available memory device excluding the defective memory device among the plurality of memory devices; and
 a processor configured for moving target data stored in the defective memory device into the OP area of the available memory device,
 wherein, after the defective memory device has been recovered, the processor moves the target data to the recovered memory device.

2. The memory system of claim 1, further comprising:
 a management circuit configured for storing availability information of the respective OP areas of the plurality of memory devices,
 wherein the selection circuit is configured to select the available memory device excluding the defective memory device among the plurality of memory devices based on the availability information.

3. The memory system of claim 2, wherein the management circuit stores respective memory maps of the plurality of memory devices.

4. The memory system of claim 3, wherein the management circuit updates the memory maps after the target data is moved to the OP area.

5. The memory system of claim 1, wherein the detection circuit monitors information on reliability of corresponding memory devices, and detects a memory device as the defective memory device, the information on the reliability of the defective memory device having a lower value than a preset threshold value.

6. The memory system of claim 1, wherein when there are a plurality of available memory devices, the selection circuit selects one or more memory devices among the available memory devices.

7. The memory system of claim 1, wherein the detection circuit updates information related to the reliability of the recovered memory device.

8. The memory system of claim 1, further comprising:
 a management circuit configured for storing availability information of the respective OP areas of the plurality of memory devices,
 wherein the selection circuit is configured to select the available memory device excluding the defective memory device among the plurality of memory devices based on the availability information, and
 wherein the management circuit updates memory maps after the operation of moving the target data is ended.

9. An operating method of a memory system, comprising:
 detecting a defective memory device among a plurality of memory devices;
 selecting an available memory device excluding the defective memory device among the plurality of memory devices;
 moving target data stored in the defective memory device into an over-provisioning (OP) area of the available memory device; and
 moving the target data to a recovered memory device, after the defective memory device has been recovered and becomes the recovered memory device.

10. The operating method of claim 9, further comprising:
 storing availability information of over-provisioning areas (OP areas) of the plurality of memory devices in a management circuit,
 wherein selecting the available memory device excluding the defective memory device among the plurality of memory devices is based on the availability information.

11. The operating method of claim 9, wherein the detecting of the defective memory device comprises monitoring information on reliability of corresponding memory devices, and detecting a memory device as the defective memory device, the information on the reliability of the defective memory device having a lower value than a preset threshold value.

12. The operating method of claim 9, further comprising storing respective memory maps of the plurality of memory devices.

13. The operating method of claim 12, further comprising updating the memory maps after the target data is moved to the OP area.

14. The operating method of claim 9, wherein when there is a plurality of available memory devices, the selecting of the available memory device comprises selecting one or more memory devices among the available memory devices according to a preset standard.

15. The operating method of claim 9, further comprising updating information related to the reliability of the recovered memory device.

16. The operating method of claim 9, further comprising updating memory maps after the moving of the target data is ended.

17. A computing system comprising:
 a plurality of memory systems; and
 a memory system management unit (MMU) configured for communicating with the plurality of memory systems,
 wherein each of the memory systems comprises a plurality of memory devices each including a user area and an over-provisioning area (OP area) and a controller configured for controlling the plurality of memory devices,
 wherein the controller comprises:
 a detection circuit configured for monitoring information on reliability of the respective memory devices, and detecting a memory device as the defective memory device, the information on the reliability of the memory device having a lower value than a preset threshold value;

a management circuit configured for storing availability information of the OP areas of the respective memory devices, and storing memory maps of the respective memory devices;

a selection circuit configured for selecting an available memory device excluding the defective memory device among the plurality of memory devices, based on the availability information; and a processor configured for moving target data stored in the defective memory device into the OP area of the available memory device, wherein, after the defective memory device has been recovered, the processor moves the target data to the recovered memory device.

18. The computing system of claim 17, wherein when the defective memory device occurs in a first memory system and the available memory device is not present in the first memory system, the first memory system provides the target data to the MMU, the MMU provides the target data to a second memory system based on the availability information received from the first memory system, and the second memory system stores the target data received from the MMU in the OP area of the available memory device, and wherein after the defective memory device has recovered, the second memory system reads the target data from the OP area and provides the read target data to the MMU, the MMU provides the target data to the first memory system, and the first memory system stores the target data in a recovered memory device.

* * * * *